(12) United States Patent
Meotto et al.

(10) Patent No.: US 9,780,107 B2
(45) Date of Patent: Oct. 3, 2017

(54) METHODS OF FORMING INTEGRATED CIRCUIT DEVICES

(71) Applicant: MICRON TECHNOLOGY, INC., Boise, ID (US)

(72) Inventors: Umberto M. Meotto, Rivoli (IT); Giulio Albini, Boise, ID (US); Paolo Tessariol, Boise, ID (US); Paola Bacciaglia, Ornago (IT); Marcello Mariani, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/969,709

(22) Filed: Dec. 15, 2015

(65) Prior Publication Data

US 2016/0104716 A1    Apr. 14, 2016

Related U.S. Application Data

(60) Continuation of application No. 13/687,726, filed on Nov. 28, 2012, now Pat. No. 9,224,873, which is a division of application No. 12/346,363, filed on Dec. 30, 2008, now Pat. No. 8,329,545.

(51) Int. Cl.
| | |
|---|---|
| *H01L 21/28* | (2006.01) |
| *H01L 27/11568* | (2017.01) |
| *H01L 27/11573* | (2017.01) |
| *H01L 29/66* | (2006.01) |
| *H01L 29/792* | (2006.01) |
| *H01L 21/02* | (2006.01) |
| *H01L 21/762* | (2006.01) |
| *H01L 29/06* | (2006.01) |

(52) U.S. Cl.
CPC .. *H01L 27/11568* (2013.01); *H01L 21/02233* (2013.01); *H01L 21/28282* (2013.01); *H01L 21/76224* (2013.01); *H01L 27/11573* (2013.01); *H01L 29/0649* (2013.01); *H01L 29/66833* (2013.01); *H01L 29/792* (2013.01)

(58) Field of Classification Search
CPC .......... H01L 27/11568; H01L 29/0649; H01L 21/28282; H01L 21/76224; H01L 21/02233; H01L 29/792; H01L 29/66833; H01L 27/11573
See application file for complete search history.

(56) References Cited

U.S. PATENT DOCUMENTS

| | | | | |
|---|---|---|---|---|
| 5,591,652 A * | 1/1997 | Matsushita | ......... | H01L 29/1033 257/E21.422 |
| 6,124,192 A * | 9/2000 | Jeng | .................. | H01L 21/76897 257/E21.507 |
| 6,218,235 B1 * | 4/2001 | Hachisuka | ........ | H01L 27/10873 257/E21.654 |
| 6,403,435 B1 | 6/2002 | Kang et al. | | |
| 7,498,226 B2 * | 3/2009 | Kim | .................. | H01L 21/31138 257/E21.427 |

(Continued)

*Primary Examiner* — Jarrett Stark
(74) *Attorney, Agent, or Firm* — Dicke, Billig & Czaja, PLLC

(57) ABSTRACT

Methods of forming integrated circuit devices containing memory cells over a first region of a semiconductor substrate and gate structures over a second region of the semiconductor substrate recessed from the first region. The methods include forming a metal that is common to both the memory cells and the gate structures.

20 Claims, 6 Drawing Sheets

(56) References Cited

U.S. PATENT DOCUMENTS

| | | | |
|---|---|---|---|
| 7,723,777 B2* | 5/2010 | Power | H01L 21/28273 |
| | | | 257/296 |
| 7,955,960 B2* | 6/2011 | Kim | H01L 27/105 |
| | | | 257/E21.54 |
| 2003/0030097 A1* | 2/2003 | Lee | H01L 21/28194 |
| | | | 257/314 |
| 2003/0042534 A1 | 3/2003 | Bhattacharyya | |
| 2003/0067032 A1* | 4/2003 | Caprara | H01L 27/115 |
| | | | 257/324 |
| 2005/0250307 A1* | 11/2005 | Park | H01L 21/76895 |
| | | | 438/618 |
| 2006/0118854 A1* | 6/2006 | Lee | H01L 27/105 |
| | | | 257/315 |
| 2006/0228860 A1* | 10/2006 | Shinohara | H01L 27/105 |
| | | | 438/257 |
| 2007/0004152 A1 | 1/2007 | Kim et al. | |
| 2007/0059883 A1* | 3/2007 | Choi | H01L 27/11568 |
| | | | 438/258 |
| 2008/0157092 A1 | 7/2008 | Arai et al. | |
| 2010/0025754 A1* | 2/2010 | Shiba | H01L 27/11568 |
| | | | 257/326 |
| 2010/0038696 A1 | 2/2010 | Power et al. | |
| 2012/0156846 A1 | 6/2012 | Thees et al. | |

* cited by examiner

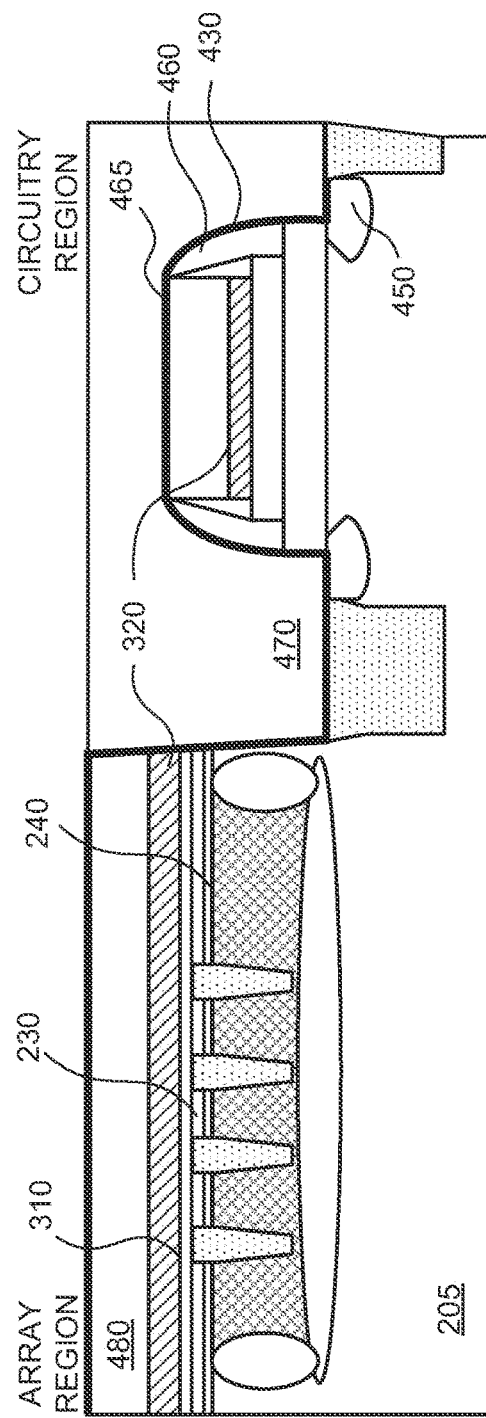

METHODS OF FORMING INTEGRATED CIRCUIT DEVICES

RELATED APPLICATIONS

This application is a continuation of U.S. patent application Ser. No. 13/687,726, filed Nov. 28, 2012, now U.S. Pat. No. 9,224,873 issued on Dec. 29, 2015 which is a divisional of U.S. patent application Ser. No. 12/346,363, filed Dec. 30, 2008, now U.S. Pat. No. 8,329,545 issued Dec. 11, 2012, each of which is commonly assigned and incorporated herein by reference in their entirety.

FIELD

Subject matter disclosed herein relates to a method of manufacturing a semiconductor integrated circuit device, and more particularly to a method of fabricating a charge trap NAND flash memory device.

BACKGROUND

Floating gate cells are typically integrated with high voltage (HV) and low voltage (LV) transistors in semiconductor devices such as NAND flash memories. A single thin oxidation is typically used to build both LV metal oxide semiconductor substrate (MOS) and LV cell structure. In such a case, an LV oxide and a tunnel oxide may grow on the substrate during the same process step. Such a single process step and a resulting structure, however, may limit scalability and reliability of the resulting structure.

BRIEF DESCRIPTION OF THE DRAWINGS

Non-limiting and non-exhaustive embodiments will be described with reference to the following figures, wherein like reference numerals refer to like parts throughout the various figures unless otherwise specified.

FIG. 4A is a cross-sectional view of a semiconductor structure along a wordline of an array region, according to an embodiment.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a charge trap NAND flash memory structure may include a metal gate layer that is common to both an array region and a circuitry, or peripheral region. Such a common metal gate layer may be used both for array connections, such as for word and/or bit lines for example, and peripheral circuitry connections. In a particular embodiment, a charge trapping layer may be disposed on a tunnel oxide layer. Such a charge trapping layer may act as a charge storage element during an operation of the NAND semiconductor device, for example. In another particular embodiment, which will be described in detail below, a double pre-metal dielectric process may be applied to an array region and a circuitry region, wherein each such region may include substantially different materials. Accordingly, an array region and a circuitry region may each involve different lithography processes, such as an etching process. In one implementation, an array region may be masked while such lithography processes are applied to a neighboring circuitry region. Thereafter, the circuitry region may be masked while lithography processes are applied to the array region, for example.

Figure 1:
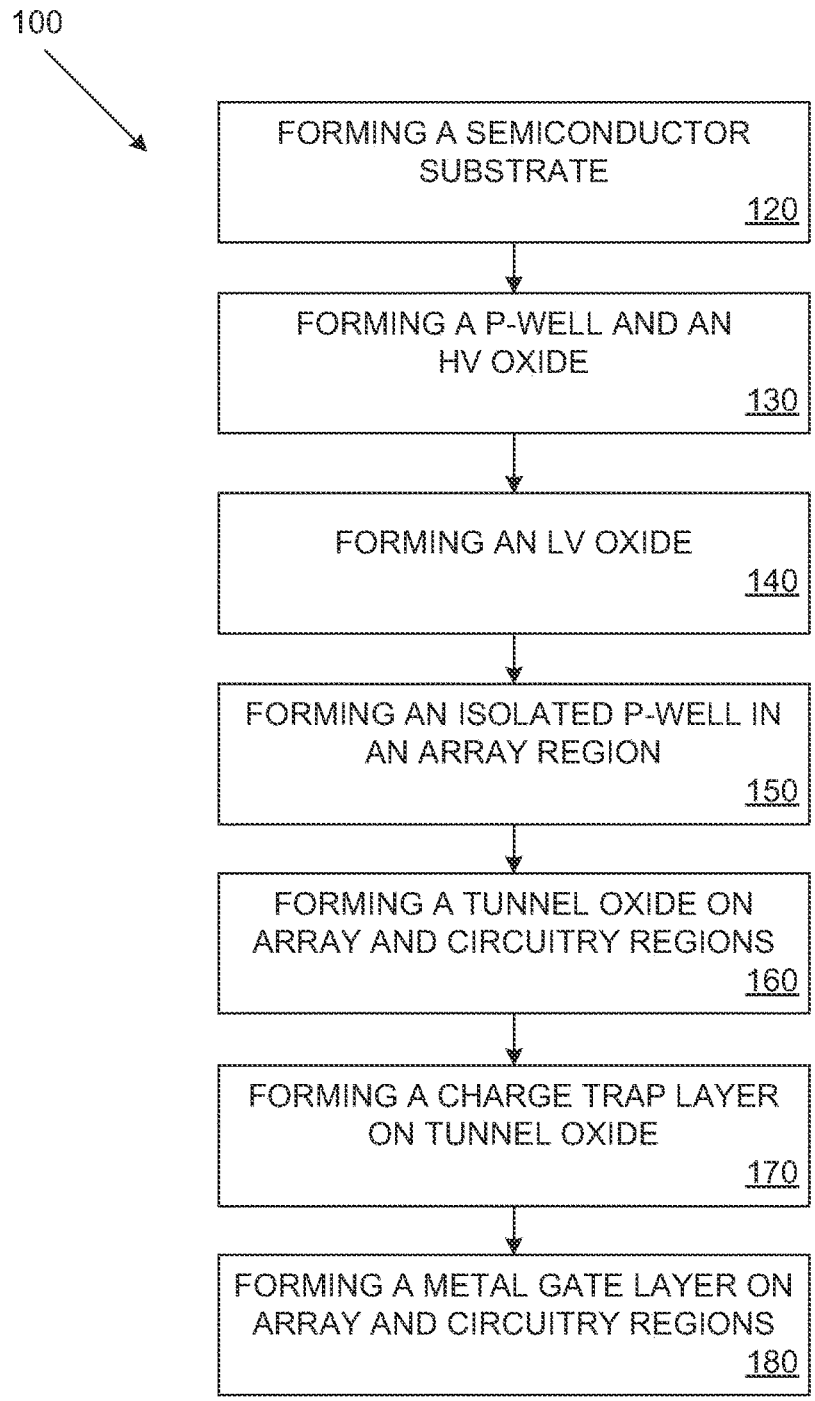
FIG. 1 is a flow diagram of a process to fabricate a charge trap NAND flash memory device, according to an embodiment.
Figure 2:
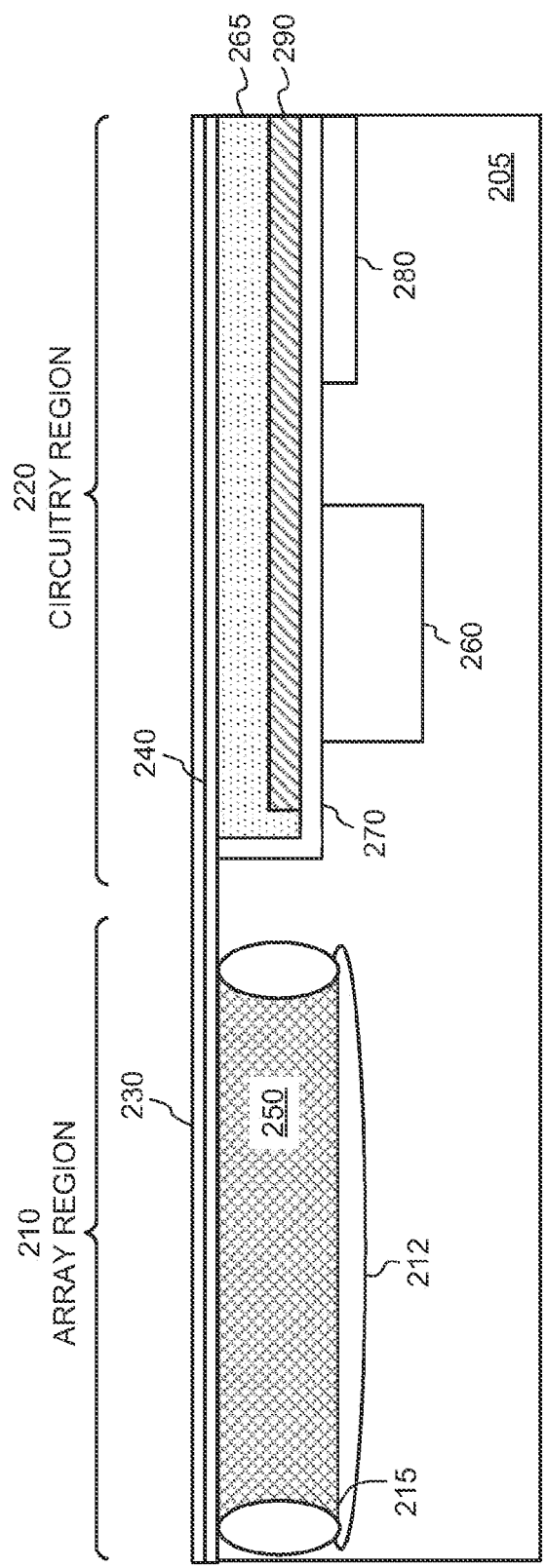
FIG. 2 is a cross-sectional view of a semiconductor structure including an array region and a circuitry region, according to an embodiment.

FIG. 1 is a flow diagram of a process 100 to fabricate a charge trap NAND flash memory device, according to an embodiment. FIG. 2 is a cross-sectional view of a semiconductor structure including an array region and a circuitry region, also according to an embodiment. At block 120, a semiconductor substrate is formed. Referring to FIG. 2, in a particular embodiment such a substrate may comprise substrate 205 including an array region 210 and a periphery circuitry region 220. Substrate 205 may include a recession so that circuitry region 220 can be formed lower than array region 210. Such a difference in height between array region 210 and circuitry region 220 may be useful to avoid problems associated with using a chemical mechanical polishing (CMP) process, for example. Such problems may include planarization by-products such as residual materials resulting from CMP process steps. Referring again to FIG. 1, at block 130, a p-well 260 may be formed in circuitry region 220 of semiconductor substrate 205. At block 140, a low voltage (LV) oxide 270 and high voltage (HV) oxide 280 may be formed from an oxide layer in circuitry region 220. In a particular embodiment, LV oxide 270 may be formed by growing an oxide layer, whereas HV oxide 280 may be formed by selective oxidation, for example. Also, LV oxide 270 may be formed on p-well 260, whereas HV oxide 280 may be formed adjacent to p-well 260. A polysilicon layer 290 may be deposited on both array region 210 and circuitry region 220 to cover LV oxide 270 and HV oxide 280. In another particular embodiment, LV oxide may be formed where LV circuitry is needed, such as on an n-well or a p-well, for example, whereas HV oxide maybe be formed in all HV regions, such as on an n-well or a p-well). A high temperature oxide (HTO) and/or PECVD oxide 265 may be formed over polysilicon layer 290. Referring to FIG. 1, at block 150, an isolated p-well 250 may be formed above a buried n-well implant 212. N-well implant walls 215 may also be formed adjacent to p-well 250. Polysilicon may be removed from array region 210 while remaining in circuitry region 220. Exposed LV oxide 270 in array region 210 may be cleaned using a wet etch (e.g., HF and/or a diluted buffered oxide etch (BOE)) until array region 210 and circuitry region 220 become substantially level. At block 160, a tunnel oxide 240 may be grown on array region 210 and on circuitry region 220, covering isolated p-well 250 and recessed circuitry. Next, at block 170, a charge trap layer 230 may be deposited on tunnel oxide 240.

Figure 3:
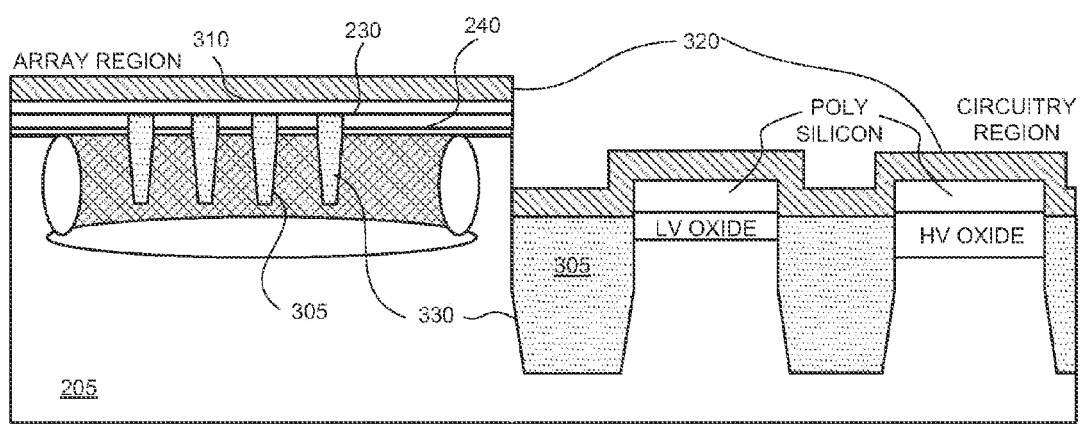
FIG. 3 is a cross-sectional view of a semiconductor structure including a charge trap layer and a metal gate, according to an embodiment.

FIG. 3 is a cross-sectional view of a semiconductor structure including a charge trap layer and a metal gate, such as those elements shown in the embodiment of FIG. 2. An insulating material 305 may be used to fill trenches 330 formed in array region 210 and circuitry region 220. Such an insulating material may include silicon dioxide, for example. Next, excess insulating material 305 may be planarized to form shallow trench isolation (STI) structures. In a particular embodiment, further processes may include a sidewall oxidation, filling, and CMP, for example. In a particular implementation, a filling process may include a high density plasma (HDP) deposition and/or a spin-on dielectric (SOD) process. A wet etch, or des ox, process may be performed to remove any excess oxide material in order to form a desirable profile for a high-k layer deposition on charge trap layer 230 in both array region 210 and circuitry region 220. In a particular implementation, such a high-k layer deposition may be removed from circuitry region 220, leaving a high-k layer 310.

Referring to FIGS. 1 and 3, at block 180, a metal gate layer 320 may be deposited on high-k layer 310 in array region 210 and on polysilicon layer 290 in circuitry region 220. In a particular embodiment, metal gate layer 320 may be common for both array region 210 and circuitry region 220. In other words, the same metal layer may be used to metalize both the array region and the peripheral transistors (FIG. 4A) in the circuitry region, for example. Accordingly, in a particular example, the metal layer used to metalize the array region and the metal layer to metalize the peripheral transistors in the circuitry region may both comprise the same material composition. Such a common metal gate layer may be used for a local interconnection between array region 210 and circuitry region 220, for example. In a particular embodiment, metal gate layer 320 may be used as an electrical connection between word lines and array/circuitry region 210/220. In another particular embodiment, metal gate layer 320 may be used as an electrical connection between a source connection and array/circuitry region 210/220. Of course, such electrical connections are merely examples, and claimed subject matter is not so limited.

In an embodiment, the semiconductor structure shown in FIG. 3 may be further treated using a NAND-one-gate-mask process flow, wherein both array region 210 and circuitry region 220 are treated at the same time by single mask processes. In another embodiment, the semiconductor structure shown in FIG. 3 may be further treated in a process flow performed for one region before the other region. For example, a process flow may be performed for array region 210 after performing a separate process flow for circuitry region 220. Such a process flow may include lithographic processes, such as masking and etching processes, for example.

Figure 4B:
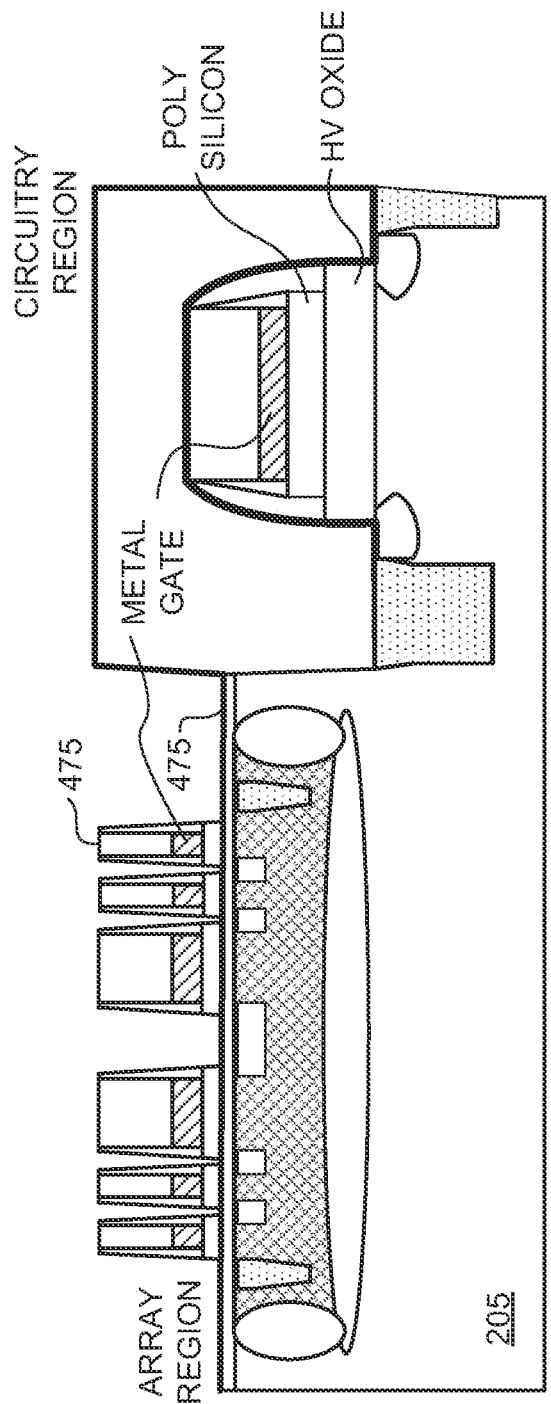
FIG. 4B is a cross-sectional view of a semiconductor structure along a bitline of an array region, according to an embodiment.

A flow process wherein a circuitry region is developed before an array region will now be described with reference to FIGS. 4A and 4B. FIG. 4A is a cross-sectional view of a semiconductor structure along a wordline of an array region and FIG. 4B is a cross-sectional view of a semiconductor structure along a bitline of an array region, according to an embodiment. An oxide hard mask (not shown) may be formed on an array region, such as array region 210 shown in FIG. 2 for example, to protect the array region during subsequent processing of a circuitry region, such as circuitry region 220 shown in FIG. 2. Such a hard mask may also be formed on a metal gate layer in circuitry region 220, though portions, such a local interconnections may be exposed and/or covered only by an etching mask. In this fashion, array region 210 may be protected while local interconnections and portions of the circuitry region, including periphery gates for example, may be patterned. Lightly doped drain (LDD) junctions 450 may be formed for both LV transistors (not shown) and HV transistors 430 in circuitry region 220 by masked ion implantation. In a particular embodiment, spacers 460 in conjunction with selective masking may be used to form such LDD junctions. Using a similar masking process, n+ and p+ junctions may be formed in circuitry region 220. Meanwhile, the hard mask protecting array region 210 may be formed thick enough to avoid ion contamination in the array region while performing ion implantation in circuitry region 220.

In a subsequent process, a conformal borderless nitride 465 may be formed. Next, a dielectric layer 470, such as silicon oxide and/or a low-k material, may be formed. Next, a CMP process may be performed on layer 470 until layer 470 is level with exposed portions of nitride 465. That is, layer 470 may be completely removed from the array region.

In an embodiment, patterning of array gates and cell definition may now be performed in array region 210. In a particular embodiment, an array gate etch may be performed in array region 210, allowing LDD and source/drain implantations without altering circuitry region 220.

Figure 5:
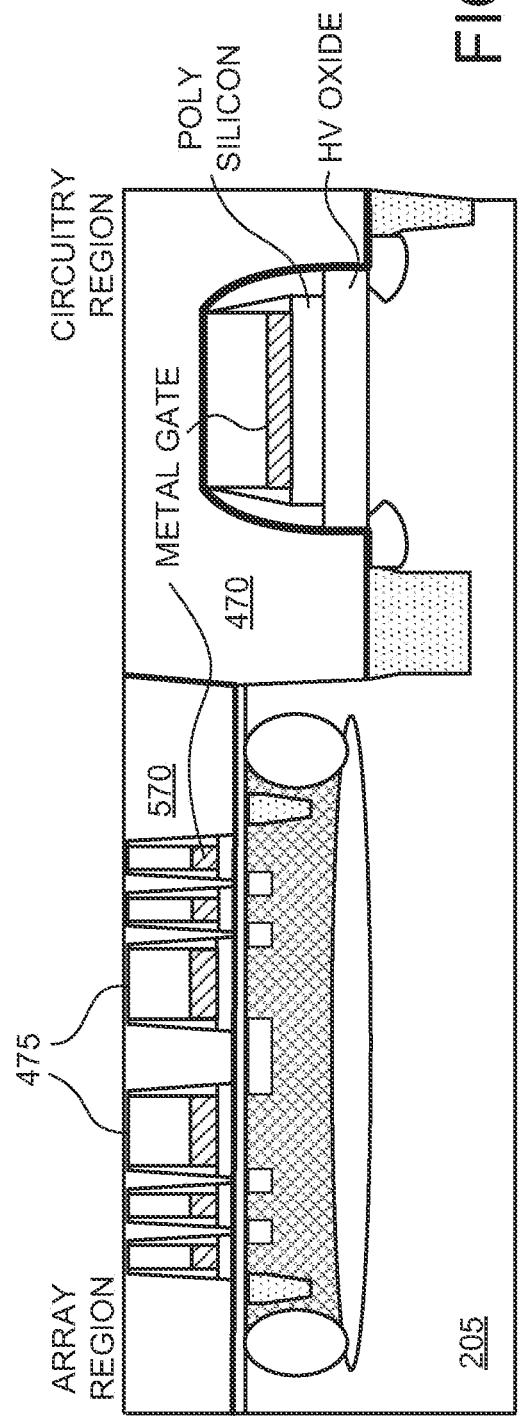
FIG. 5 is a cross-sectional view of a semiconductor structure including pre-metal deposition, according to an embodiment.

FIG. 5 is a cross-sectional view of a semiconductor structure showing a dielectric layer 570, such as silicon oxide and/or a low-k material, formed adjacent to cells in array region 210, according to an embodiment. A CMP process may be performed on layer 570 until layer 570 is substantially level with exposed portions of nitride 475. In a particular embodiment, a process subsequent to process 100 shown in FIG. 1 may conclude by forming various contacts, including a dual damascene back end process.

While there has been illustrated and described what are presently considered to be example embodiments, it will be understood by those skilled in the art that various other modifications may be made, and equivalents may be substituted, without departing from claimed subject matter. Additionally; many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method of forming an integrated circuit device, comprising:
   forming an isolated well structure in a first region of a semiconductor substrate;
   forming a first oxide over a second region of the semiconductor substrate, wherein the second region of the semiconductor substrate is recessed from the first region of the semiconductor substrate;
   forming polysilicon over the first oxide;
   forming a second oxide over the first region of the semiconductor substrate and over the second region of the semiconductor substrate;
   forming a charge trapping material over the second oxide;
   forming a dielectric over the charge trapping material;
   forming a metal over and in contact with an upper surface of the dielectric and over and in contact with an upper surface of the polysilicon;
   forming a gate structure over the second region of the semiconductor substrate, the gate structure comprising a portion of the metal in contact with a portion of the upper surface of the polysilicon, a portion of the polysilicon comprising the portion of the upper surface of the polysilicon, and a portion of the first oxide, but no portion of the second oxide, no portion of the charge trapping material and no portion of the dielectric; and forming a memory cell over the isolated well structure, the memory cell comprising a portion of the metal in contact with a portion of the upper surface of the dielectric, a portion of the dielectric comprising the portion of the upper surface of the dielectric, a portion of the charge trapping material and a portion of the second oxide.

2. The method of claim 1, wherein forming the isolated well structure comprises:
 forming an n-well implant in the semiconductor substrate;
 forming a p-well in the semiconductor substrate above the n-well implant; and
 forming n-well implant walls adjacent to the p-well.

3. The method of claim 1, further comprising doping junctions in the second region of the semiconductor substrate adjacent the gate structure.

4. The method of claim 1, further comprising:
 removing portions of the metal over the second region of the semiconductor substrate to form the portion of the metal of the gate structure;
 removing portions of the polysilicon over the second region of the semiconductor substrate to form the portion of the polysilicon of the gate structure; and
 removing portions of the first oxide over the second region of the semiconductor substrate to form the portion of the first oxide of the gate structure.

5. The method of claim 4, further comprising:
 removing portions of the metal over the first region of the semiconductor substrate to form the portion of the metal of the memory cell;
 removing portions of the dielectric over the first region of the semiconductor substrate to form the portion of the dielectric of the memory cell;
 removing portions of the charge trapping material over the first region of the semiconductor substrate to form the portion of the charge trapping material of the memory cell; and
 removing portions of the second oxide over the first region of the semiconductor substrate to form the portion of the second oxide of the memory cell.

6. The method of claim 5, wherein removing portions of the metal, the dielectric, the charge trapping material and the second oxide over the first region of the semiconductor substrate further forms a portion of the metal, a portion of the dielectric, a portion of the charge trapping material and a portion of the second oxide for a gate structure over the first region of the semiconductor substrate adjacent the memory cell.

7. The method of claim 1, further comprising forming a third oxide in the second region of the semiconductor prior to forming the first oxide.

8. The method of claim 7, wherein forming the third oxide comprises performing selective oxidation of a portion of the second region of the semiconductor substrate.

9. The method of claim 7, further comprising forming a second gate structure over the second region of the semiconductor, the second gate structure comprising a portion of the metal, a portion of the polysilicon and the third oxide.

10. The method of claim 9, further comprising:
 removing portions of the metal over the second region of the semiconductor substrate to form the portion of the metal of the gate structure and the portion of the metal of the second gate structure; and
 removing portions of the polysilicon over the second region of the semiconductor substrate to form the portion of the polysilicon of the gate structure and the portion of the polysilicon of the second gate structure.

11. The method of claim 1, wherein forming the metal over and in contact with the dielectric and over and in contact with the polysilicon comprises concurrently depositing a same metal over and in contact with the dielectric and over and in contact with the polysilicon.

12. The method of claim 1, further comprising:
 forming the gate structure prior to forming the memory cell; and
 forming a nitride over the first region of the semiconductor substrate and over the second region of the semiconductor substrate after forming the gate structure and prior to forming the memory cell.

13. A method of forming an integrated circuit device, comprising:
 forming an isolated well structure in a first region of a semiconductor substrate;
 forming a first oxide in a second region of the semiconductor substrate, wherein the second region of the semiconductor substrate is recessed from the first region of the semiconductor substrate;
 forming a second oxide over the second region of the semiconductor substrate;
 forming polysilicon over the second oxide;
 forming a third oxide over the polysilicon, wherein forming the third oxide over the polysilicon comprises forming the third oxide over the second region of the semiconductor substrate to be level with a surface of the first region of the semiconductor substrate;
 forming a fourth oxide over the first region of the semiconductor substrate and the second region of the semiconductor substrate;
 forming a charge trapping material over the fourth oxide over the first region of the semiconductor substrate and the second region of the semiconductor substrate;
 removing the charge trapping material, the fourth oxide and the third oxide over the second region of the semiconductor substrate;
 forming a dielectric over the charge trapping material;
 forming a metal over and in contact with an upper surface of the dielectric, and over and in contact with an upper surface of the polysilicon;
 forming a first gate structure over the second region of the semiconductor substrate, the first gate structure comprising a portion of the metal in contact with a first portion of the upper surface of the polysilicon, a portion of the polysilicon comprising the first portion of the upper surface of the polysilicon, and a portion of the first oxide;
 forming a second gate structure over the second region of the semiconductor substrate, the second gate structure comprising a portion of the metal in contact with a second portion of the upper surface of the polysilicon, a portion of the polysilicon comprising the second portion of the upper surface of the polysilicon and a portion of the second oxide; and
 forming a memory cell over the isolated well structure, the memory cell comprising a portion of the metal in contact with a portion of the upper surface of the dielectric, a portion of the dielectric comprising the portion of the upper surface of the dielectric, a portion of the charge trapping material and a portion of the fourth oxide.

14. The method of claim 13, wherein forming the first gate structure and forming the second gate structure comprises forming the first oxide for operation of the first gate structure at a first voltage level and forming the second oxide for operation of the second gate structure at a second voltage level lower than the first voltage level.

15. The method of claim 13, further comprising:
wherein forming the first oxide comprises oxidizing a portion of the second region of the semiconductor substrate;
wherein forming the second oxide comprises growing the second oxide over the second region of the semiconductor substrate; and
wherein forming the metal comprises concurrently depositing a same metal over the dielectric and over the polysilicon.

16. The method of claim 13, further comprising:
forming a first trench in an area of the isolated well structure;
filling the first trench with an insulating material;
forming a second trench in an area of the second region of the semiconductor substrate between an area for formation of the first gate structure and an area for formation of the second gate structure; and
filling the second trench with an insulating material.

17. A method of forming an integrated circuit device, comprising:
forming an isolated p-well structure in a first region of a semiconductor substrate;
forming a second p-well in a second region of the semiconductor substrate, wherein the second region of the semiconductor substrate is recessed from the first region of the semiconductor substrate;
selectively oxidizing a portion of a second region of the semiconductor substrate adjacent to the second p-well to form a first oxide;
forming a second oxide over the second region of the semiconductor substrate, wherein forming the second oxide comprises forming the second oxide over the first oxide;
forming polysilicon over the second oxide;
forming a third oxide over the second region of the semiconductor substrate to be level with the first region of the semiconductor substrate;
forming a tunnel oxide over the first region of the semiconductor substrate and the second region of the semiconductor substrate;
forming a charge trapping material over the tunnel oxide over the first region of the semiconductor substrate and the second region of the semiconductor substrate;
removing the charge trapping material, the tunnel oxide and the third oxide over the second region of the semiconductor substrate;
forming a dielectric over the charge trapping material;
forming a metal over the dielectric and over the polysilicon concurrently;
forming a first gate structure over the second region of the semiconductor substrate for operation at a first voltage level, the first gate structure comprising a portion of the metal, a portion of the polysilicon and a portion of the first oxide;
forming a second gate structure over the second p-well for operation at a second voltage level lower than the first voltage level, the second gate structure comprising a portion of the metal, a portion of the polysilicon and a portion of the second oxide; and
forming a memory cell over the isolated p-well structure, the memory cell comprising a portion of the metal, a portion of the dielectric, a portion of the charge trapping material and a portion of the tunnel oxide.

18. The method of claim 17, wherein forming the dielectric comprises forming a high-k dielectric.

19. The method of claim 17, further comprising:
forming a nitride over the first region of the semiconductor substrate and over the second region of the semiconductor substrate prior to forming the memory cell.

20. The method of claim 19, further comprising:
forming a second dielectric over the first region of the semiconductor substrate after forming the memory cell;
forming a third dielectric over the second region of the semiconductor substrate after forming the first gate structure; and
removing portions of the second dielectric and the third dielectric to a level of the nitride over the memory cell.

* * * * *